(12) United States Patent
Shim et al.

(10) Patent No.: US 7,148,086 B2
(45) Date of Patent: Dec. 12, 2006

(54) SEMICONDUCTOR PACKAGE WITH CONTROLLED SOLDER BUMP WETTING AND FABRICATION METHOD THEREFOR

(75) Inventors: Il Kwon Shim, Singapore (SG); Sheila Marie L. Alvarez, Singapore (SG); Sheila Rima C. Magno, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 10/908,120

(22) Filed: Apr. 28, 2005

(65) Prior Publication Data

US 2006/0246629 A1 Nov. 2, 2006

(51) Int. Cl.
*H01L 21/44* (2006.01)

(52) U.S. Cl. .................. 438/123; 438/111; 438/612; 257/666; 257/673

(58) Field of Classification Search ............... 438/106, 438/108, 111, 123, 612; 257/666, 673, E23.039; 437/217, 206, 220
See application file for complete search history.

(56) References Cited

U.S. PATENT DOCUMENTS

| | | | |
|---|---|---|---|
| 6,214,642 B1 * | 4/2001 | Chen et al. ............... 438/108 |
| 6,310,390 B1 * | 10/2001 | Moden ...................... 257/668 |
| 6,482,680 B1 * | 11/2002 | Khor et al. ................ 438/123 |
| 6,507,120 B1 | 1/2003 | Lo et al. .................... 257/778 |
| 6,577,012 B1 | 6/2003 | Greenwood et al. ....... 257/766 |
| 6,661,087 B1 | 12/2003 | Wu ............................ 257/692 |
| 6,865,084 B1 * | 3/2005 | Lin et al. ................... 361/704 |
| 2002/0031902 A1 | 3/2002 | Pendse et al. ............. 438/612 |
| 2004/0072396 A1 * | 4/2004 | Tiziani et al. ............. 438/200 |
| 2004/0178481 A1 | 9/2004 | Joshi et al. ................ 257/678 |
| 2005/0173783 A1 * | 8/2005 | Chow et al. ............... 257/666 |
| 2006/0012055 A1 * | 1/2006 | Foong et al. .............. 257/780 |

* cited by examiner

*Primary Examiner*—Thao P. Le
(74) *Attorney, Agent, or Firm*—Mikio Ishimaru

(57) ABSTRACT

A semiconductor package and a method of manufacturing a semiconductor package include a substrate having a plurality of lead fingers. A plurality of stud bumps is attached to the plurality of lead fingers. A die having a plurality solder bumps is provided. The plurality of solder bumps is attached to the plurality of stud bumps to form a plurality of electrical connections and provide controlled collapse of the plurality of solder bumps. An encapsulant encapsulates the die, the electrical connections, and the plurality of lead fingers to expose a lower surface of the plurality of lead fingers. The plurality of stud bumps may include a plurality of clusters of stud bumps.

10 Claims, 4 Drawing Sheets

SEMICONDUCTOR PACKAGE WITH CONTROLLED SOLDER BUMP WETTING AND FABRICATION METHOD THEREFOR

TECHNICAL FIELD

The present invention relates generally to semiconductors, and more particularly to a method and apparatus for manufacturing a semiconductor with controlled solder bump wetting.

BACKGROUND ART

Semiconductors, or computer chips, have made their way into virtually every electrical product manufactured today. Chips are used not only in very sophisticated industrial and commercial electronic equipment, but also in many household and consumer items such as televisions, clothes washers and dryers, radios and telephones. As many of these types of products become smaller but more functional, there is a need to include more chips in these smaller products. The reduction in size of cellular telephones is one example of how more and more capabilities find their way into smaller and smaller electronic products.

As electronic technology has progressed, dies having more powerful functions in smaller semiconductor packages have been developed. Electronic products are increasingly light and compact due to the efficient fabrication of many types of high-density semiconductor packages. One such package is a flip chip semiconductor package.

In a flip chip semiconductor package, bumps are formed on the bonding pads of a die. Each bump contacts a corresponding contact point on a leadframe, or other substrate, so that the die and the leadframe, or substrate, are electrically connected. Compared with conventional wire bonding and tape automated bonding (TAB) methods of joining a chip with a leadframe or substrate, the flip-chip design provides a shorter overall conductive path and hence better electrical performance in a smaller semiconductor package.

The number of bumps is heated so the number of bumps reflows to form a number of electrical connections between the die and the leadframe or substrate. During the reflow process, as the temperature is raised, the solder bumps collapse. This therefore forms a metallic compound layer between the solder bumps and the contact regions on the leads in an effort to reinforce the bonding between the solder bumps and the leads. The formation of the metallic compound is called a wetting process. However, due to the wetability of the lead frame, after the solder bumps are bonded to predetermined positions on the leads of the lead frame, the solder bumps still keep collapsing and extending outwardly to spread on the leads. This over-collapsing of the solder bumps results in cracking of the bonds, which adversely effects the electrical connection. Furthermore, the over-collapsed solder bumps also significantly decrease the height between the die and the leads. The reduced height has a detrimental effect on subsequent processes in semiconductor fabrication.

Various other methods of bump attachment and bump collapse control for flip chip on a leadframe or substrate have been in practice. In general, the other methods commonly are focused on pre-treatment of the number of lead fingers on the leadframe by laser, etching, masking, or using other wettable metals. Some make use of solder either dispensed or printed on the lead fingers. The pre-treatment of the fingers of the leadframe typically involves higher cost in leadframe manufacture by requiring additional processes that contribute to increasing the manufacturing cycle time and resulting higher yield losses.

One proposed solution involves forming a solder mask on predetermined positions of the leads, wherein the solder mask has at least one opening with a predetermined size for bonding the solder bumps thereto. This proposed solution utilizes the opening size of the solder mask for controlling the amount of collapse of the solder bumps. As the size of the opening increases, the solder bumps can extend outwardly to a greater extent; that is, the larger the collapse amount, the smaller the vertical height of the solder bumps correspondingly. Therefore, with the control in the collapse degree of the solder bumps, the height difference between the semiconductor chip and the leads can be predetermined, thus eliminating the occurrence of the over-collapsing of the solder bumps. However, the formation of the solder mask on the lead frame uses processes such as screen-printing or photolithographic patterning processes, which are quite complex and expensive.

Another proposed solution involves forming a layer of underfill material with or without a flux additive over the entire surface of the leads and positioning the solder bumps into the layer of underfill material until the solder bumps contact the leads. This solution precludes the use of an underfilling process subsequent to die attach thereby increasing the possibility of the creation of gaps or voids in the underfill material, which adversely effect the performance and reliability of the semiconductor.

Another proposed solution uses a solder alloy having a higher melting point in an attempt to control the over-collapsing of the solder bumps. However, such solder bumps generally are more expensive.

Solutions to these problems have been long sought but prior developments have not taught or suggested any solutions and, thus, solutions to these problems have long eluded those skilled in the art.

DISCLOSURE OF THE INVENTION

The present invention provides semiconductor package and a method of manufacturing a semiconductor package including a substrate having a plurality of lead fingers. A plurality of stud bumps is attached to the plurality of lead fingers. A die having a plurality solder bumps is provided. The plurality of solder bumps is attached to the plurality of stud bumps to form a plurality of electrical connections and provide controlled collapse of the plurality of solder bumps. An encapsulant encapsulates the die, the electrical connections, and the lead fingers to expose a lower surface of the plurality of lead fingers. The plurality of stud bumps may include a plurality of clusters of stud bumps.

The present invention provides a semiconductor package having a wettable surface on the lead fingers that controls solder bump wetting, thus achieving control of solder bump collapse and consistent standoff between a die and a substrate in a semiconductor package.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
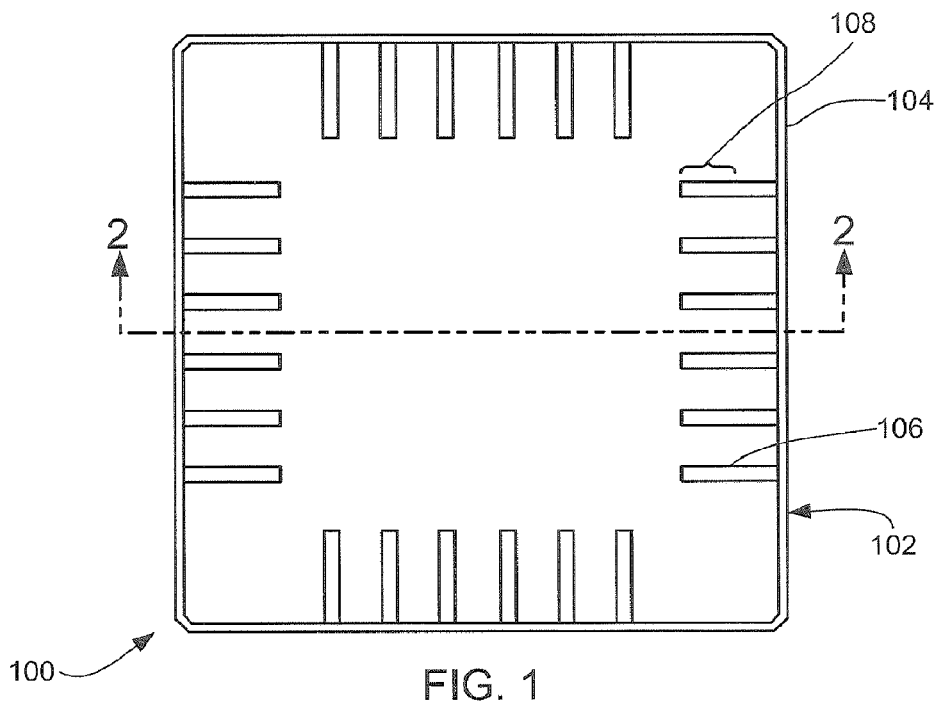
FIG. 1 is a plan view of a semiconductor package at an intermediate stage of manufacture in accordance with the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail.

Likewise, the drawings showing embodiments of the devices are semi-diagrammatic and not to scale and, particularly, some of the dimensions are for the clarity of presentation and are shown greatly exaggerated in the FIGs. Generally, the device can be operated in any orientation. In addition/Also, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the die, regardless of its orientation. The term "vertical" refers to a direction perpendicular to the horizontal as just defined. Terms, such as "on", "above", "below", "bottom", "top", "side", "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a plan view of a semiconductor package 100 at an intermediate stage of manufacture in accordance with the present invention. The semiconductor package includes a leadframe 102, or other suitable substrate. It will be apparent to those skilled in the art upon a reading of this disclosure that the leadframe 102 can be any substrate having wettable lead fingers or contacts upon which a semiconductor device is mounted using solder balls or bumps. Typically, the substrate includes at least one of a leadframe, a printed wiring board, a flame-retardant fiberglass (FR4) board, an organic circuit board, a ceramic substrate, a hybrid circuit substrate, an integrated circuit package, a semiconductor substrate, a polyimide tape, a flex circuit, a high-density interconnect board, an electronic module, and combinations thereof.

The leadframe 102 has an outer frame 104 and a number of lead fingers 106. The number of lead fingers 106 extends inwardly from the outer frame 104. The number of lead fingers 106 has a number of solder bump contact areas 108. The leadframe 102 typically is made of a conductive material, such as copper.

Figure 2:
FIG. 2 is a cross-sectional view of the structure of FIG. 1 taken along line 2—2.

Referring now to FIG. 2, therein is shown a cross-sectional view of the structure of FIG. 1 taken along line 2—2. The number of lead fingers 200 is representative of the number of lead fingers 106 shown in FIG. 1. The number of lead fingers 200 has an upper surface 202. The number of lead fingers 200 is at least one of copper, a substrate material plated with bondable metal, a substrate material plated with a wettable metal, a substrate material selectively plated with a bondable metal, a substrate material selectively plates with a wettable metal, and combinations thereof. The number of lead fingers may be selectively plated substantially only in the number of solder bump contact areas 108 with the foregoing metals.

Figure 3:
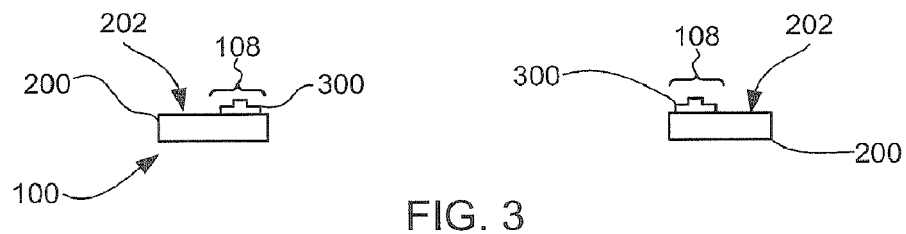
FIG. 3 is the structure of FIG. 2 after formation of a stud bump on a lead finger.

Referring now to FIG. 3, therein is shown the structure of FIG. 2 after formation of a number of stud bumps 300 on the upper surface 202 of the number of lead fingers 200. The number of stud bumps 300 is formed using a wire bonding process. The wire bonding process is performed with conventional wirebonding equipment that has stud bumping capability. Typically, the number of stud bumps is at least one of gold (Au), copper (Cu), and combinations thereof.

The number of stud bumps 300 is formed using a wire of a diameter that provides the number of stud bumps 300 that is smaller than or substantially equal to the size of the solder bumps on the die to be attached to the number of lead fingers 200 as discussed below. The number of stud bumps 300 having, for example, a diameter of 50–60 um, will require a substantially larger diameter wire than is used for standard wire bonding using conventional wirebonding equipment with stud bump capability. The number of stud bumps 300 is coined or sheared to form a flat bondable upper surface.

Figure 4:
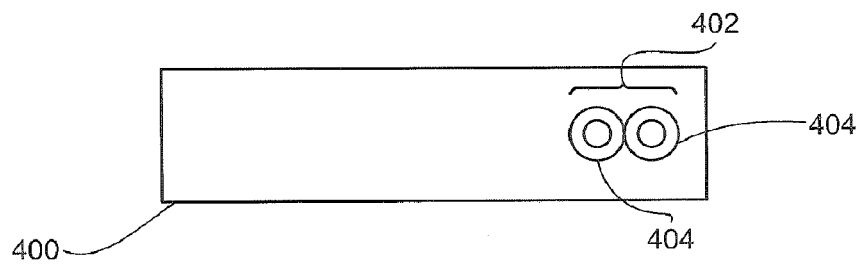
FIG. 4 is an enlarged top view of a lead finger of a leadframe having a cluster of two stud bumps.

Referring now to FIG. 4, therein is shown an enlarged top view of a lead finger 400 of a leadframe (not shown) having a cluster 402 of a number of stud bumps 404. In FIG. 4, the number of stud bumps 404 forming the cluster 402 is two. The number of stud bumps 404 is formed near each other to form the cluster 402. The combined diameter of the number of stud bumps 404 is smaller than or substantially equal to the diameter of the solder bumps on the die to be attached to the lead finger 400. Accordingly, a smaller diameter wire is used to form the number of stud bumps 404 having a given total diameter than would be required to form one stud bump having a diameter that is smaller than or substantially equal to the diameter of the solder bumps.

Figure 5:
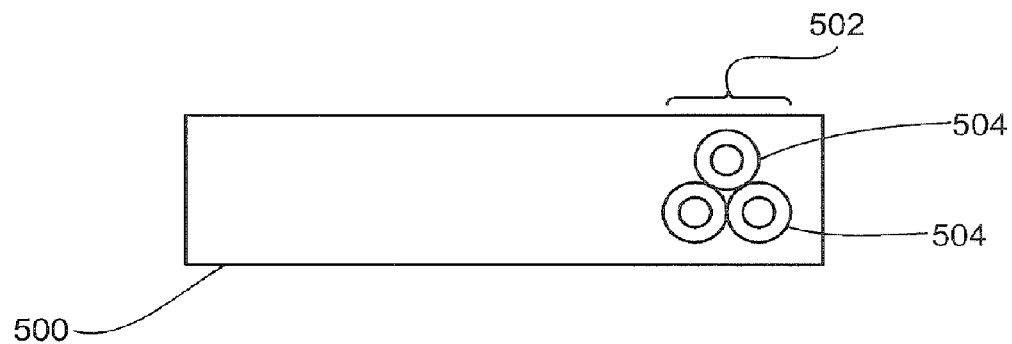
FIG. 5 is an enlarged top view of a lead finger of a lead frame having a cluster of three stud bumps.

Referring now to FIG. 5, therein is shown an enlarged top view of a lead finger 500 of a lead frame (not shown) having a cluster 502 of a number of stud bumps 504. In FIG. 5, the number of stud bumps 504 forming the cluster 502 is three. The number of stud bumps 504 is formed near each other to form the cluster 502. The combined diameter of the number of stud bumps 504 is smaller than or substantially equal to the diameter of the solder bumps on the die to be attached to the lead finger 500. Accordingly, a smaller diameter wire is used to form the number of stud bumps 504 having a given total diameter than would be required to form one stud bump having a diameter that is smaller than or substantially equal to the diameter of the solder bumps.

Figure 6:
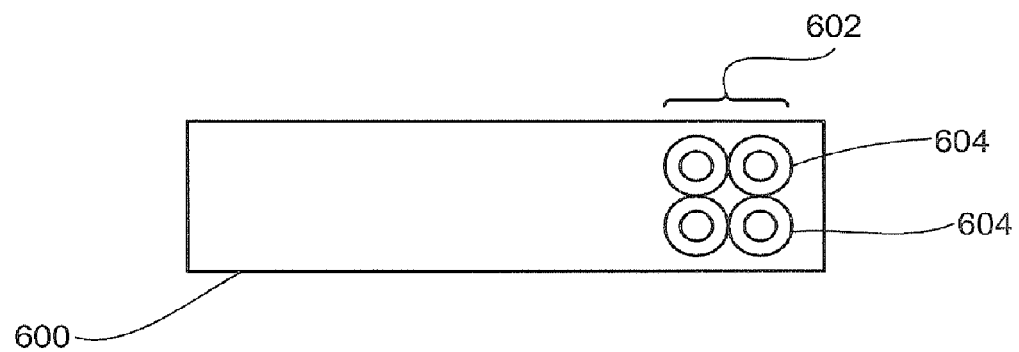
FIG. 6 is an enlarged top view of a lead finger of a lead frame having a cluster of four stud bumps.

FIG. 6 is an enlarged top view of a lead finger 600 of a lead frame (not shown) having a cluster 602 of a number of stud bumps 604. In FIG. 6, the number of stud bumps 604 forming the cluster 602 is four. The number of stud bumps 604 is formed near each other to form the cluster 602. The combined diameter of the number of stud bumps 604 is smaller than or substantially equal to the diameter of the solder bumps on the die to be attached to the lead finger 600. Accordingly, a smaller diameter wire is used to form the number of stud bumps 604 having a given total diameter than would be required to form one stud bump having a diameter that is smaller than or substantially equal to the diameter of the solder bumps.

Figure 7:
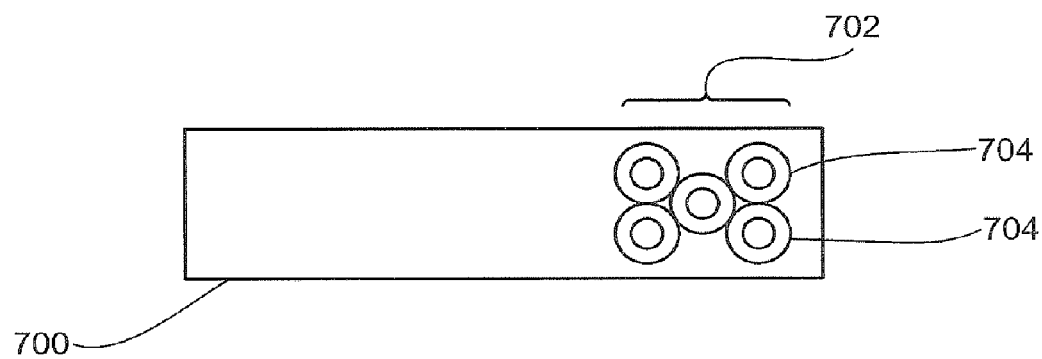
FIG. 7 is an enlarged top view of a lead finger of a lead frame having a cluster of five stud bumps.

FIG. 7 is an enlarged top view of a lead finger 700 of a lead frame (not shown) having a cluster 702 of a number of stud bumps 704. In FIG. 7, the number of stud bumps 704 forming the cluster 702 is four. The number of stud bumps 704 is formed near each other to form the cluster 702. The combined diameter of the number of stud bumps 704 is smaller than or substantially equal to the diameter of the solder bumps on the die to be attached to the lead finger 700. Accordingly, a smaller diameter wire is used to form the number of stud bumps 704 having a given total diameter than would be required to form one stud bump having a diameter that is smaller than or substantially equal to the diameter of the solder bumps.

It has been discovered that a standard diameter wire, typically in the range of about 0.6–1.2 mils in diameter, may be used to form the cluster of the number of stud bumps resulting in the ability to use conventional wire diameters to form a variety of diameters of the cluster of stud bumps without altering existing wirebonding manufacturing equipment. The number and arrangement of the number of stud bumps can be varied to meet the requirements of a particular semiconductor package. Additionally, it has been discovered that use of a single stud bump or a cluster of stud bumps enhances the integrity of the solder joint made by connecting the solder bumps on the die to the single stud bump or a cluster of stud bumps on the lead fingers and controls the collapse of the solder bumps.

Figure 8:
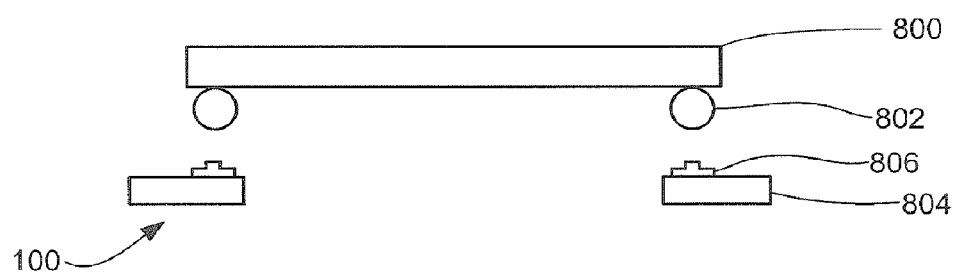
FIG. 8 is a cross sectional view of the semiconductor package before die attach and encapsulation.

Referring now to FIG. 8, therein is shown a cross sectional view of the semiconductor package 100 after prior to die attach and encapsulation. A die 800 has a number of solder bumps 802 formed on the lower surface of the die 800. The number of solder bumps 802 is at least one of a leaded solder, eutectic, lead-free alloy, and combinations thereof. The number of solder bumps 802 may be formed, for example, by electroplating one or more metals such as lead and tin to form a lead-tin solder bump. The number of solder bumps 802 also may be formed by depositing layers of one or more metals on an interconnection surface of the die and using conventional photolithographic techniques to pattern and etch any undesired metal. The number of solder bumps 802 also may be heat treated to melt the number of solder bumps 802 to form a rounded shape. Alternatively, the number of solder bumps 802 may be formed by positioning solder balls or bumps on the contact pads (not shown) of the die 800 and heating the solder balls or bumps to adhere them to the contact pads of the die 800. Alternatively, the number of solder bumps 802 may be formed by selectively screen printing solder paste on the contact pads on the die 800, and then heating the die 800 to melt the solder paste and form the number of solder bumps 802.

The die 800 is placed on a number of lead fingers 804 using a conventional die pick and place process. The number of solder bumps 802 on the lower surface of the die 800 typically is dipped in a flux to produce a perimeter of wettable area on the number of solder bumps 802. The flux also may be sprayed, printed, or otherwise applied to the number of solder bumps 802.

Figure 9:
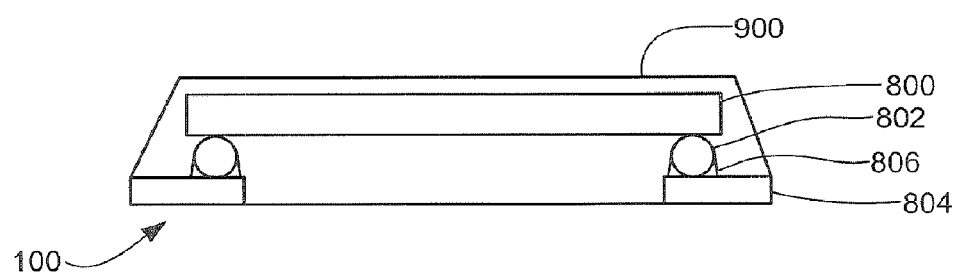
FIG. 9 is a cross-sectional view of the structure of FIG. 8 after die attach and encapsulation.

Referring now to FIG. 9, therein is shown the structure of FIG. 8 after die attach and encapsulation. The number of solder bumps 802 is placed into a number of stud bumps 806. The number of stud bumps 806 shown in FIGS. 8 and 9 is representative of the number of stud bumps 300 shown in FIG. 3, the cluster 402 of the number of stud bumps 404 shown in FIG. 4, the cluster 502 of the number of stud bumps 504 shown in FIG. 5, the cluster 602 of the number of stud bumps 604 shown in FIG. 6, and the cluster 702 of the number of stud bumps 704 shown in FIG. 7.

The number of solder bumps 802 displaces a centrally located portion of the number of stud bumps 806. The number of stud bumps 806 surrounds a base portion of the number of solder bumps 802 when the number of stud bumps 806 is displaced by the number of solder bumps 802.

The number of solder bumps 802 is reflowed by heating to form an interconnection between the die 800 and the lead fingers 804. The assembled die 800 and the number of lead fingers 804 are heated, such as by using at least one of an infrared, convective, forced-air, and combinations thereof, furnace to heat the number of solder bumps 802 and the number of stud bumps 806. An electrical connection between the number of solder bumps 802 and the lead fingers 804 is formed. The number of solder bumps 802 flows around a portion of the number of the number of stud bumps 806 and become soldered to the lead fingers 804. The number of stud bumps 806 control the collapse of the number of solder bumps 802. Alternatively, the number of solder bumps 802 may be locally heated and pressed against the lead fingers 804 to displace the number of solder bumps 802 around the number of stud bumps 806, and to reflow the number of solder bumps 802.

An encapsulant 900 is formed over the die 800, the number of solder bumps 802, and the lead fingers 804 using a molding compound, such as an epoxy.

Figure 10:
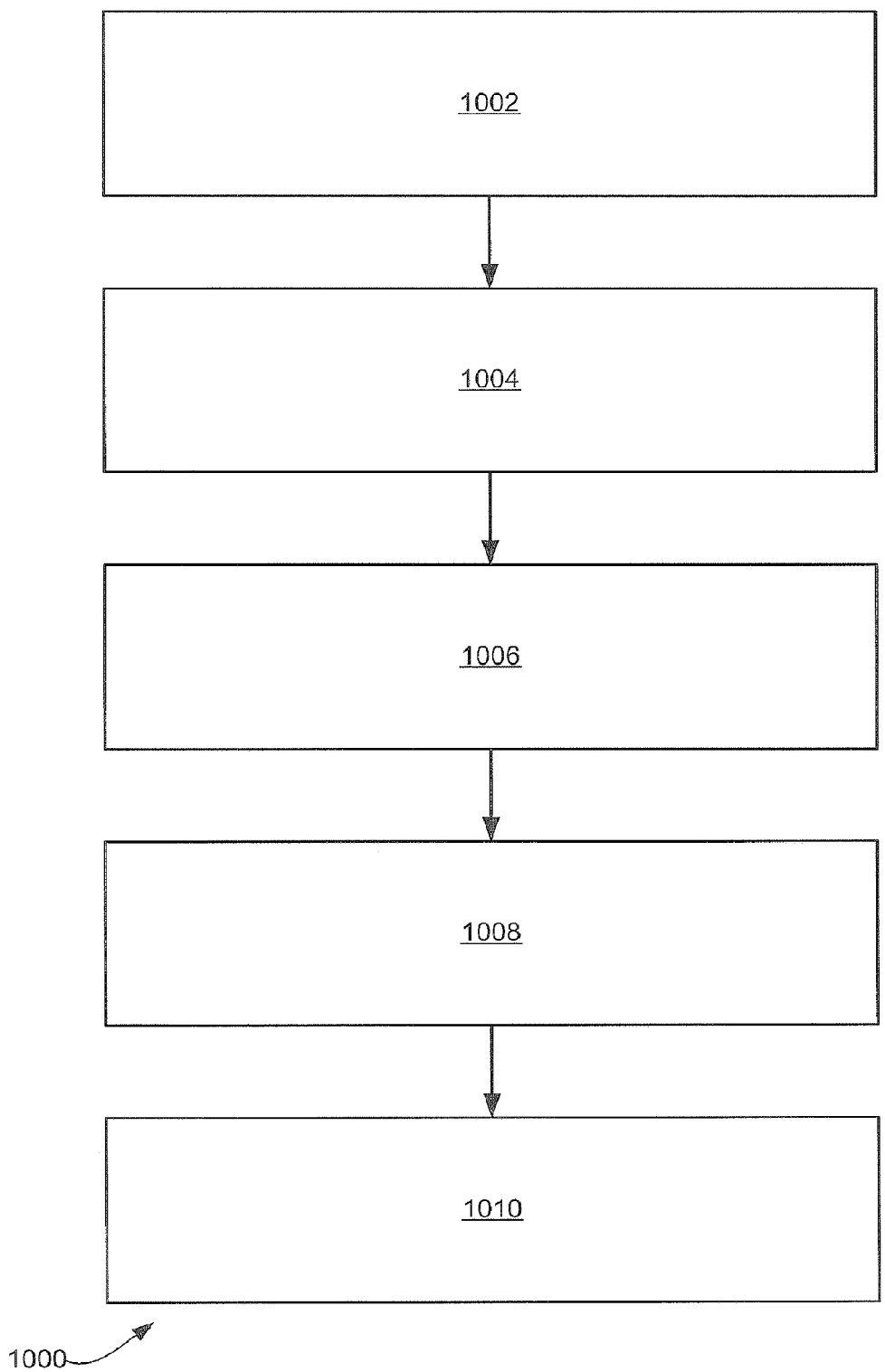
FIG. 10 is a flow chart of a method for manufacturing a semiconductor package in accordance with the present invention.

Referring now to FIG. 10, therein is shown a flow chart of a method 1000 for manufacturing a semiconductor package in accordance with the present invention. The method 1000 includes providing a substrate having a plurality of lead fingers in a block 1002; attaching a plurality of stud bumps to the plurality of lead fingers in a block 1004; providing a die having a plurality solder bumps in a block 1006; attaching the plurality of solder bumps to the plurality of stud bumps to form a plurality of electrical connections and provide controlled collapse of the plurality of solder bumps in a block 1008; and encapsulating the die, the electrical connections, and the lead fingers to expose a lower surface of the plurality of lead fingers in a block 1010.

Thus, it has been discovered that the method and apparatus of the present invention furnish important and heretofore unavailable solutions, capabilities, and functional advantages for semiconductor manufacturing. The resulting process and configurations are straightforward, economical, uncomplicated, highly versatile and effective, use conventional technologies, and are thus readily suited for manufacturing semiconductor devices that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a semiconductor package, comprising:

providing a substrate having a plurality of lead fingers;
attaching a plurality of stud bumps to the plurality of lead fingers;
forming the plurality of stud bumps to form flat bondable surface thereon;
providing a die having a plurality solder bumps;
attaching the plurality of solder bumps to the plurality of stud bumps to form a plurality of electrical connections and provide controlled collapse of the plurality of solder bumps; and
encapsulating the die, the electrical connections, and the lead fingers to expose a lower surface of the plurality of lead fingers.

2. The method of manufacturing a semiconductor package as claimed in claim 1, wherein:
providing the plurality of solder bumps provides a plurality of solder bumps having a first diameter; and
attaching the plurality of stud bumps attaches a plurality of stud bumps having a second diameter smaller than or substantially equal to the first diameter.

3. The method of manufacturing a semiconductor package as claimed in claim 1, wherein attaching the plurality of stud bumps uses a wire bonding process.

4. The method of manufacturing a semiconductor package as claimed in claim 1, wherein:
attaching a plurality of stud bumps attaches a plurality of clusters of stud bumps; and
the plurality of clusters of stud bumps comprise at least two stud bumps.

5. The method of manufacturing a semiconductor package as claimed in claim 1, wherein attaching the plurality of stud bumps attaches stud bumps of at least one of copper, gold, and a combination thereof.

6. A method of manufacturing a semiconductor package, comprising:
providing a leadframe having a plurality of lead fingers;
attaching a plurality of stud bumps to the plurality of lead fingers;
forming the plurality of stud bumps to form flat bondable surfaces thereon;
providing a die having a plurality solder bumps;
vertically aligning the plurality of solder bumps to the plurality of stud bumps;
reflowing the plurality of solder bumps to form a plurality of electrical connections with the plurality of stud bumps and provide controlled collapse of the plurality of solder bumps; and encapsulating the die, the electrical connections, and the lead fingers to expose a lower surface of the plurality of lead fingers.

7. The method of manufacturing a semiconductor package as claimed in claim 6, wherein:
providing the plurality of solder bumps provides a plurality of solder bumps having a first diameter; and
attaching the plurality of stud bumps attaches a plurality of stud bumps having a second diameter smaller than or substantially equal to the first diameter.

8. The method of manufacturing a semiconductor package as claimed in claim 6, wherein attaching the plurality of stud bumps uses a wire bonding process.

9. The method of manufacturing a semiconductor package as claimed in claim 6, wherein:
attaching a plurality of stud bumps attaches a plurality of clusters of stud bumps; and
the plurality of clusters of stud bumps comprise at least two stud bumps.

10. The method of manufacturing a semiconductor package as claimed in claim 6, wherein attaching the plurality of stud bumps attaches stud bumps of at least one of copper, gold, and a combination thereof.

* * * * *